US010727174B2

(12) United States Patent
Belonio, Jr. et al.

(10) Patent No.: US 10,727,174 B2
(45) Date of Patent: Jul. 28, 2020

(54) INTEGRATED CIRCUIT PACKAGE AND A METHOD FOR FORMING A WAFER LEVEL CHIP SCALE PACKAGE (WLCSP) WITH THROUGH MOLD VIA (TMV)

(71) Applicant: Dialog Semiconductor (UK) Limited, London (GB)

(72) Inventors: Jesus Mennen Belonio, Jr., Neubiberg (DE); Shou Cheng Eric Hu, Taichung (TW); Ernesto Gutierrez, III, Swindon (GB); Jerry Li, Taichung (TW)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 16/131,721

(22) Filed: Sep. 14, 2018

(65) Prior Publication Data

US 2020/0091051 A1   Mar. 19, 2020

(51) Int. Cl.
*H01L 23/495* (2006.01)
*H01L 23/498* (2006.01)
(Continued)

(52) U.S. Cl.
CPC ...... *H01L 23/49816* (2013.01); *H01L 21/486* (2013.01); *H01L 21/4853* (2013.01);
(Continued)

(58) Field of Classification Search
USPC .......................... 257/668, 774, 713, 737, 773
See application file for complete search history.

(56) References Cited

U.S. PATENT DOCUMENTS

| 6,004,867 A | 12/1999 | Kim et al. |
| 7,700,412 B2 * | 4/2010 | Shen ...................... H01L 21/565 438/112 |

(Continued)

FOREIGN PATENT DOCUMENTS

WO   WO 2018/004897   1/2018

OTHER PUBLICATIONS

"Molding Process Developent for Low-Cost MEMS-WLCSP with Silicon Pillars and Cu Wires as Verical Interconnections," by Mian Zhi Ding et al., 2017 IEEE 19th Electronics Pckaging Technology Conference (EPTC), Singapore, Dec. 6-9, 2017, pp. 1-6.
(Continued)

*Primary Examiner* — Niki H Nguyen
(74) *Attorney, Agent, or Firm* — Saile Ackerman LLC; Stephen B. Ackerman; Billy Knowles (57) ABSTRACT

A method for forming a wafer level chip scale package begins with providing an integrated circuit wafer. Applying a dielectric material to the surface of the integrated circuit wafer. A redistribution conductive layer is formed upon the dielectric material to make contact with the input/output contacts of the integrated circuit. A polymer-based film is applied to the surface of the integrated circuit wafer and is subjected to a compression molding process. Alignment marks are placed on the edge of the integrated circuit wafer. A laser ablation process is implemented to prepare through mold via (TMV) in the cured thermoset plastic material. The solder ball or copper pillar input/output connector is placed in the through mold via (TMV). A reflow process is instigated to connect the input/output connector to the redistribution conductive layer's pad surface.

25 Claims, 4 Drawing Sheets

(51) Int. Cl.
*H01L 23/31* (2006.01)
*H01L 23/544* (2006.01)
*H01L 21/48* (2006.01)
*H01L 21/56* (2006.01)

(52) U.S. Cl.
CPC .......... *H01L 21/4857* (2013.01); *H01L 21/56* (2013.01); *H01L 23/3171* (2013.01); *H01L 23/49827* (2013.01); *H01L 23/544* (2013.01); *H01L 2223/54426* (2013.01)

(56) References Cited

U.S. PATENT DOCUMENTS

| | | | |
|---|---|---|---|
| 9,543,242 B1 | 1/2017 | Kelly et al. | |
| 2013/0196499 A1* | 8/2013 | Burgess | H01L 24/11 |
| | | | 438/614 |
| 2013/0280826 A1* | 10/2013 | Scanlan | H01L 23/544 |
| | | | 438/15 |
| 2014/0162407 A1* | 6/2014 | Zwenger | H01L 24/19 |
| | | | 438/113 |
| 2016/0093580 A1 | 3/2016 | Scanlan et al. | |
| 2017/0338196 A1* | 11/2017 | Chiu | H01L 25/10 |

OTHER PUBLICATIONS

"Electrical Characterization of Wafer Level Fan-Out (WLFO) Using Film Substrate for Low cost Millimeter Wave Application," by Seung Jae Lee et al., 2010 Proceedings 60th Electronic Components and Technology Conference (ECTC), Jun. 1-4, 2010, pp. 1461-1467.

"A Reliable Wafer-Level Chip Scale Package (WLCSP) Technology," by Umesh Sharma, Ph.D., et al., California Micro Devices, Inc. and Ozen Engineering, Inc., Conference: IWLPC (Wafer-Level Packaging), Published: Sep. 17, 2007, 6 pages.

"Chip Scale Review," The International Magazine for the Semiconductor Packaging Industry, vol. 15, No. 2, Mar.-Apr. 2011, ChipScaleReview.com, pp. 1-48.

* cited by examiner

INTEGRATED CIRCUIT PACKAGE AND A METHOD FOR FORMING A WAFER LEVEL CHIP SCALE PACKAGE (WLCSP) WITH THROUGH MOLD VIA (TMV)

TECHNICAL FIELD

This disclosure relates generally to semiconductor devices and, more particularly, methods for forming a wafer level chip scale package (WLSCP) for an integrated circuit device.

BACKGROUND

In current wafer level chip scale package (WLSCP), four masks that include one under ball metal (UBM) layer, one redistribution layer (RDL), and two polymer layers are implemented in the processing of the current 8" and 12" integrated circuit wafers for wafer level chip scale packaging. There are now four processes that include coating, photolithography exposure, and developing required in WLCSP process. This makes package cost relatively high.

WLCSP processing may include two masks for forming a UBM layer and a polymer layer with direct ball drop. The two mask process of the WLCSP has many drawbacks that include layer cracking in a 55 nm low k dielectric layer during surface mount technology (SMT) processing and requiring extra underfill material to pass board level reliability (BLR) during thermal cycling of the printed circuit board test. These drawbacks limit of the package size.

"A Reliable Wafer-level Chip Scale Package (WLSCP) Technology}, Sharma, Holland et al., International Wafer Level Packaging Conference 2007 Proceedings, September, 2007, describes a conventional two mask process WLCSP process, after defining the under bump metal (UBM) layer, a solder ball is dropped in the UBM opening. A subsequent thermal reflow cycle melts the solder ball and cools it in a well defined shape on top of the UBM layer. Sharma et al. systematically analyzes the problem of passivation cracking and presents a WLCSP process that is resistant to cracking during solder flow and subsequent multiple reflow steps.

"Technology Solutions for a Dynamic and Diverse WLCSP Market", Chilukuri, Chip Scale Review, March/April 2011, Volume 15, Number 2, pp.: 16-19, describes two mask and four mask WLCSP processes and examines material options i.e., polymers and solder alloys for these new structures and the effects of die sizes and I/O counts on product reliability. Board level reliability (BLR) data and analyses of the failure modes is presented.

Figure 1:
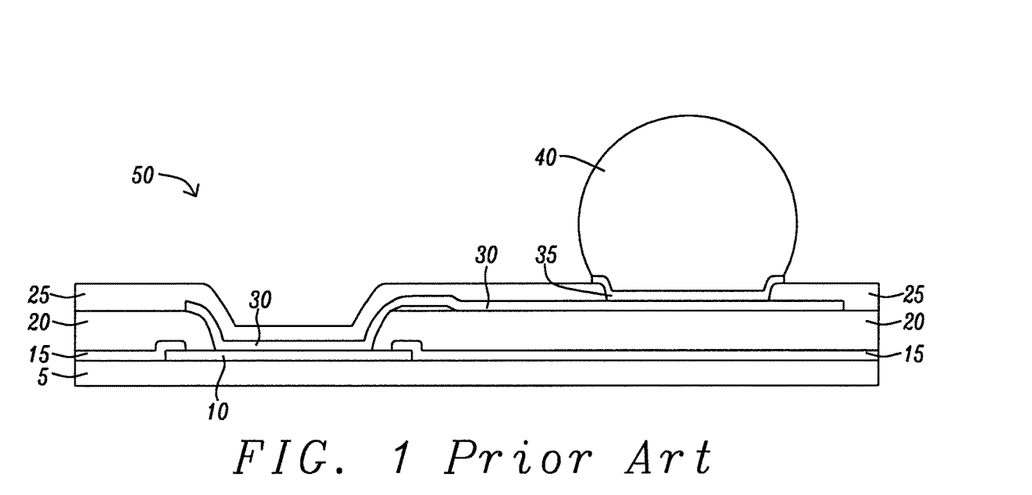
FIG. 1 is a cross-sectional diagram of a four-mask process for forming a ball bond connection system of an integrated circuit chip for connecting to a second level packaging (board or module) for wafer level chip scale packages as described in Chilukuri of the prior art.

FIG. 1 is a cross-sectional diagram of a four-mask process for forming a ball bond connection system of an integrated circuit chip for connecting to a second level packaging (board or module) for wafer level chip scale packages as described in Chilukuri of the prior art. Referring now FIG. 1, the wafer 5 has been processed to embed electronic circuitry into the surface of the wafer 5 for each integrated circuit chip. After the embedding of the electronic circuitry, the surface of the wafer 5 is coated with a passivation layer 15 to protect the electronic circuitry. The surface of the passivation layer 15 has openings that align with the input/output contacts 10 of the embedded electronic circuitry. A first mask is placed over the wafer covering the locations of the opening aligned with the input/output contacts 10. The wafer 5 is coated with a first insulating material 20 over the passivation layer 15. A second mask is placed on the first insulating material 20. Openings in the second mask provide access of the redistribution layer (RDL) 30 to the input/output contacts 10. A third mask is applied to the surface of the wafer 5. Openings in the third mask define the paths of the redistribution layer (RDL) 30. The redistribution layer (RDL) 30 is a metal layer formed over the surface of the first insulating material 20 to make the input/output contacts 10 of the integrated circuit available in other locations, such as the location of an input/output connector 40 for connection to the second level package. A second insulating material 25 is placed on the surface of the wafer 5. A fourth mask is placed over the surface of the wafer 5 with openings at a location where the input/output connector 40 is to be placed. The under ball metal (UBM) 35 is formed within the opening of the second insulating material 25. In this example, the input/output connector 40 is a solder ball that is placed with the opening of the second insulating layer 25. The solder ball 40 solder balls are reflowed onto the under ball metal 35 creating a large standoff.

Figure 2:
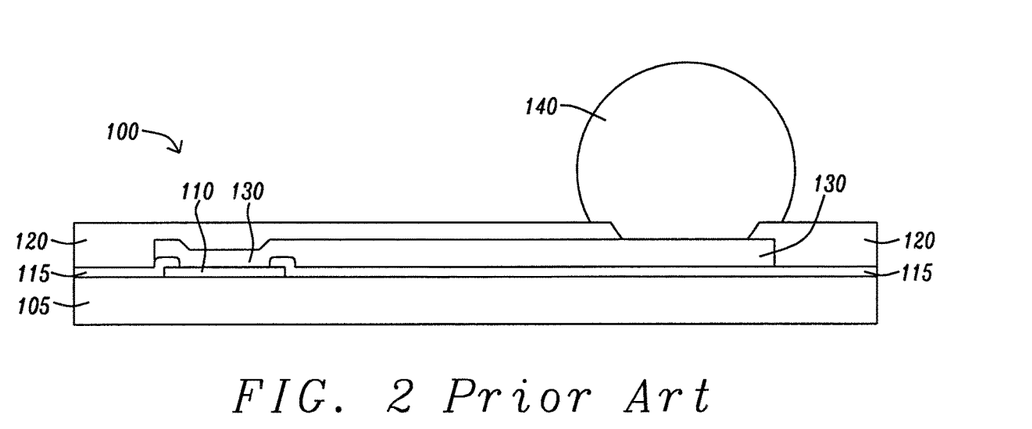
FIG. 2 is a cross-sectional diagram of a two-mask process for forming a ball bond connection system of an integrated circuit chip for connecting to a second level packaging (board or module) for wafer level chip scale packages as described in Sharma et al. and Chilukuri of the prior art.
Figure 3A:
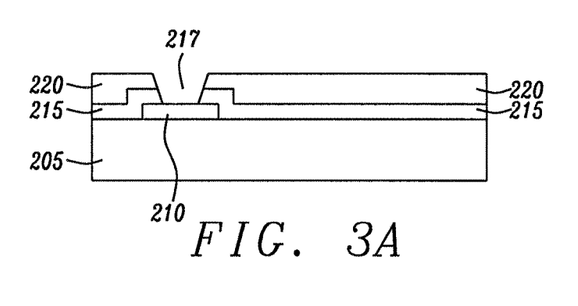
FIGS. 3A-3F are cross-sectional diagrams of a two-mask process for forming a ball bond connection system of an integrated circuit chip for connecting to a second level packaging (board or module) for wafer level chip scale packages of the present disclosure.
Figure 3B:
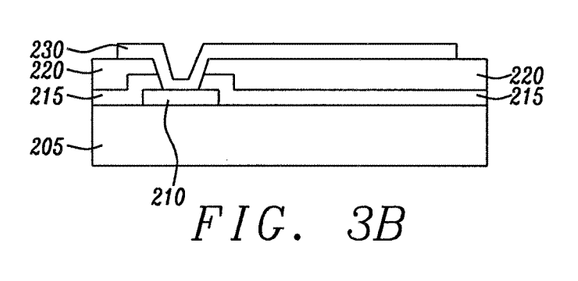
Figure 3C:
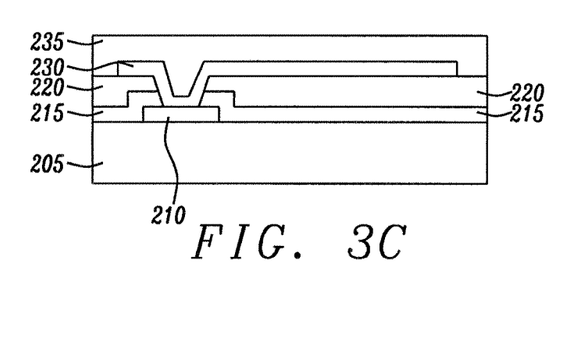
Figure 3D:
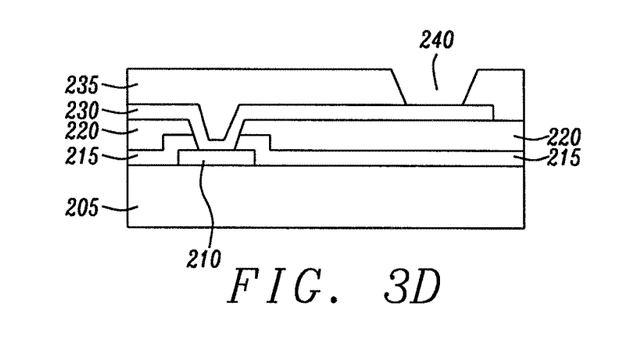
Figure 3E:
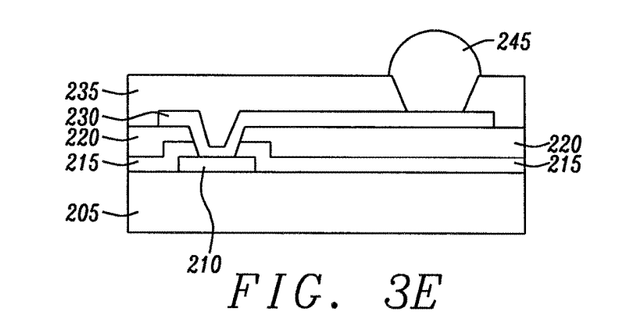
Figure 3F:
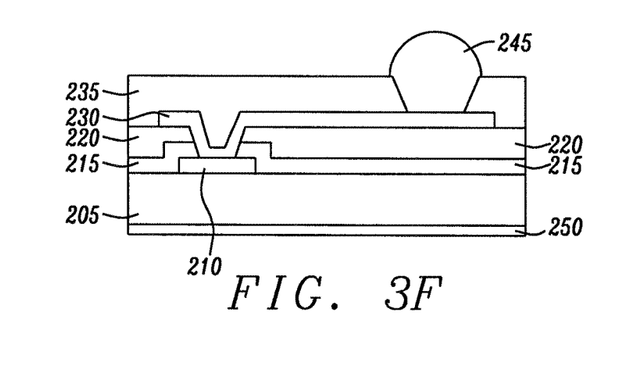

FIG. 2 is a cross-sectional diagram of a two-mask process for attaching and connecting chip to second level packaging (board or module) for wafer level chip scale packages as described in Sharma et al. and Chilukuri. Referring now to FIG. 2, the wafer 105 has been processed to embed electronic circuitry into the surface of the wafer 105 for each integrated circuit chip. After the embedding of the electronic circuitry, the surface of the wafer 105 is coated with a passivation layer 115 to protect the electronic circuitry. The surface of the passivation layer 115 has openings that align with the input/output contacts 110 of the embedded electronic circuitry. The openings are filled with a metal such as aluminum or copper to contact the input/output contact 110. A first mask is placed on the passivation layer 115 with openings that define the paths of the redistribution layer (RDL) 130. The redistribution layer (RDL) 130 is a metal layer formed over the surface of the passivation layer 115 to make the input/output contacts 110 of the integrated circuit available in other locations, such as the location of an input/output connector 140 for connection to the second level package. A second insulating material 125 is placed on the surface of the surface of the wafer 105. A second mask is placed over the surface of the wafer 105 with openings at a location where the input/output connector 140 is to be placed. The under ball metal (UBM) 135 is formed within the opening of the second insulating material 125. In this example, the input/output connector 140 is a solder ball that is placed with the opening of the second insulating layer 125. The solder balls 140 are reflowed onto the under ball metal 135 creating a large standoff.

SUMMARY

An object of this disclosure is to provide a method for forming a Wafer level Chip Scale Package (WLSCP) package.

To accomplish at least this object, the method begins with providing an integrated circuit wafer having been patterned with functional electronic circuitry and covered with a passivation insulation layer with openings to allow access to the input/output contacts of the integrated circuit. A coating of a dielectric material is applied to the integrated circuit wafer. The integrated circuit wafer undergoes a photo exposure and developing process to define the opening locations for a redistribution layer interconnection. The dielectric material is a photo-sensitive polymer dielectric such as Polyimide (PI), Polybenzoxazole (PBO), and Benzocyclobutene (BCB).

The redistribution conductive layer is formed upon the dielectric polymer layer to make contact through the openings in the dielectric layer and the passivation layer with the input/output contacts of the integrated circuit formed on the surface of the integrated circuit wafer. The redistribution conductive layer is formed by sputtering a seed layer material such as titanium (TI) or copper (Cu) on the coating of dielectric material. A coating photoresist is spun onto the integrated circuit wafer. The photo resist is photo exposed and developed to define redistribution conductive layer pattern. An electrical plating process is activated to apply a copper or aluminum layer to the redistribution layer to its targeted thickness. The photoresist material is removed by a striping process and a chemical etching is used to remove unnecessary seed layer. A plasma process is activated to clean the surface of the passivation and redistribution conductive layer surface.

A polymer-based film is applied to the surface of the integrated circuit wafer and is subjected to a compression molding process. The polymer-based film in various embodiments a thermoset plastic such as an epoxide commonly known as Epoxy. In various other embodiments, the polymer-based film is a polymer with a high glass transition temperature (Tg) that is high enough to prevent the polymer-based film from softening within the operating temperature of an integrated circuit chip from the integrated circuit wafer.

Alignment marks that provide guides for the locations of the through mold visa (TMV) are placed on the edge of the integrated circuit wafer and exposed after the molding process. A post mold curing process is performed on the integrated circuit wafer to let the molding compound material to be fully cross linked.

The cured thermoset plastic material is laser ablated to prepare through mold vias (TMV) in in the location of an input/output connector for connection to the second level package. The input/output connectors are solder balls or copper pillars. Oxidation on the redistribution conductive layer's pad surface is removed by flux printing or pin transferring before the input/output connectors are placed to get better solder joint connection. Upon the oxidation removal, the input/output connectors are placed in the through mold vias (TMV). A reflow process is instigated to connect the input/output connectors to the redistribution conductive layers' pad surface.

In various embodiments where the input/output connectors are solder balls the reflow process is a solder reflow of the solder that forms the solder balls. In various embodiments where the input/output connectors are copper pillars, the copper pillars are coated with a solder paste and the solder paste is reflowed to connect the copper pillars with the redistribution conductive layers' pad surface.

Upon completion of the connection of the input/output connectors, a backside film is affixed to the backside of the integrated circuit wafer for preventing scratching or cracking. The backside film is a polymer-based film is applied to the backside surface of the integrated circuit wafer. The backside film in various embodiments a thermoset plastic such as an epoxide commonly known as Epoxy. In various other embodiments, the backside film is a polymer with a high glass transition temperature (Tg) that is high enough to prevent the polymer-based film from softening within the operating temperature of an integrated circuit chip from the integrated circuit wafer.

In another embodiment that accomplishes at least this object, an integrated circuit chip module contains an integrated circuit chip having been patterned with functional electronic circuitry and covered with a passivation insulation layer with openings to allow access to the input/output contacts of the integrated circuit chip. A redistribution conduction layer is formed upon the dielectric polymer layer to make contact through the openings in the dielectric layer and the passivation layer with the input/output contacts of the integrated circuit formed on the surface of the integrated circuit chip with the locations where the input/output contacts are attached. The redistribution conduction layer is formed by coating the surface of the integrated circuit wafer containing the integrated circuit chip with a coating of a dielectric material. The integrated circuit wafer undergoes a photo exposure and developing process to define the opening locations for a redistribution conductive layer connection. The dielectric material is a photo-sensitive polymer dielectric such as Polyimide (PI), Polybenzoxazole (PBO), and Benzocyclobutene (BCB).

The redistribution conductive layer includes a sputtered a seed layer material such as titanium (TI) or copper (Cu) laid on the coating of dielectric material. The sputtered seed material is characterized by spinning a coating of photoresist onto the integrated circuit wafer. The photo resist is photo exposed and developed to define redistribution conductive layer pattern. The redistribution conductive layer further includes an a copper or aluminum layer that is electrically plated on the integrated circuit wafer containing the integrated circuit chip to its targeted thickness. The photoresist material is removed by a striping process and a chemical etching is used to remove unnecessary seed layer. A plasma process is activated to clean the surface of the passivation and redistribution conductive layer surface.

The integrated circuit chip includes a polymer-based film applied to the surface of the integrated circuit wafer and is subjected to a compression molding process. The polymer-based film in various embodiments a thermoset plastic such as an epoxide commonly known as Epoxy. In various other embodiments, the polymer-based film is a polymer with a high glass transition temperature (Tg) that is high enough to prevent the polymer-based film from softening.

In the manufacturing of the package of the integrated circuit chip on a wafer containing multiple integrated circuit chips, alignment marks are placed on the edge of the integrated circuit wafer and exposed after the molding process. A post mold curing process is performed on the integrated circuit wafer to let the molding compound material to be fully cross linked.

The polymer-based film on the surface of the integrated circuit chip has through mold vias (TMV) formed by a laser ablation process in the location of an input/output connector for connection to the second level package. The integrated circuit chip has input/output connector placed and soldered in each of the through mold vias. The input/output connector is a solder ball or copper pillar. In the manufacturing process, oxidation on the redistribution conductive layer's pad surface is removed by flux printing or pin transferring before input/output connector placement to get better solder joint connection. Upon the oxidation removal, the input/output connectors are placed in the through mold vias (TMV). A reflow process is instigated to connect the input/output connectors to the redistribution conductive layers' pad surface.

In various embodiments where the input/output connector is a solder ball the reflow process is a solder reflow of the solder that forms the solder ball. In various embodiments where the input/output connector are copper pillars, the copper pillars are coated with a solder paste and the solder paste is reflowed to connect the copper pillars with the redistribution conductive layer's pad surfaces.

The integrated circuit chip includes a backside film that is affixed to the backside of the integrated circuit wafer for preventing scratching or cracking. The backside film is a polymer-based film is applied to the backside surface of the integrated circuit wafer. The backside film in various embodiments a thermoset plastic such as an epoxide commonly known as Epoxy. In various other embodiments, the backside film is a polymer with a high glass transition temperature (Tg) that is high enough to prevent the polymer-based film from softening.

DETAILED DESCRIPTION

FIGS. 3A-3F are cross-sectional diagrams of a two-mask process for forming a ball bond 245 connection system of an integrated circuit chip 205 for connecting to a second level packaging (board or module) for wafer level chip scale packages of the present disclosure. An integrated circuit wafer 205 arrives from an integrated circuit fabrication line. The integrated circuit wafer 205 is patterned with functional electronic circuitry and covered with a passivation insulation layer 215 with openings 217 to allow access to the input/output contacts of the integrated circuit 205. A coating of a dielectric material 220 is applied to the integrated circuit wafer 205. The integrated circuit wafer 205 undergoes a photo exposure and developing process to define the opening locations for a redistribution layer interconnection. The dielectric material 220 is a photo-sensitive polymer dielectric such as Polyimide (PI), Polybenzoxazole (PBO), and Benzocyclobutene (BCB).

The redistribution conductive layer 230 is formed upon the dielectric polymer layer 220 to make contact through the openings 217 in the dielectric layer and the passivation layer with the input/output contacts of the integrated circuit formed on the surface of the integrated circuit wafer 205. The redistribution conductive layer 230 is formed by sputtering a seed layer material such as titanium (TI) or copper (Cu) on the coating of dielectric material 220. A coating photoresist is spun onto the integrated circuit wafer 205. The photo resist is photo exposed and developed to define redistribution conductive layer pattern. An electrical plating process is activated to apply a copper or aluminum layer to the redistribution layer to its targeted thickness. The photo-resist material is removed by a striping process and a chemical etching is used to remove unnecessary seed layer. A plasma process is activated to clean the surface of the passivation 220 and redistribution conductive layer 230 surface.

A polymer-based film 235 is applied to the surface of the integrated circuit wafer 205 and is subjected to a compression molding process. The polymer-based film 235 in various embodiments a thermoset plastic such as an epoxide commonly known as Epoxy. In various other embodiments, the polymer-based film is a polymer with a high glass transition temperature (Tg) that is high enough to prevent the polymer-based film from softening. In some embodiments the polymer-base film has a glass transition temperature (Tg) that has a range of approximately 80° C. to approximately 150° C.

Alignment marks (not shown) are placed on the edge of the integrated circuit wafer 205 and exposed after the molding process. A post mold curing process is performed on the integrated circuit wafer 205 to let the molding compound material to be fully cross linked.

A laser ablation process is implemented to prepare through mold vias (TMV) 240 in the cured thermoset plastic material 235 in the location of an input/output connectors 245 for connection to the second level package. The input/output connectors 245 are solder balls 245 or copper pillars (255 in FIGS. 4b and 4c). Oxidation on the redistribution conductive layers' 235 pad surfaces are removed by flux printing or pin transferring before input/output connectors 240 placement to get better solder joint connection. Upon the oxidation removal, the solder balls 245 are placed in the through mold vias (TMV) 240. A reflow process is instigated to connect the solder balls 245 to the redistribution conductive layers' 230 pad surfaces.

Upon completion of the connection of the solder balls 245, a backside film 250 is affixed to the backside of the integrated circuit wafer for preventing scratching or cracking. The backside film 250 is a polymer-based film is applied to the backside surface of the integrated circuit wafer 205. The backside film 250 in various embodiments a thermoset plastic such as an epoxide commonly known as Epoxy. In various other embodiments, the backside film 250 is a polymer with a high glass transition temperature (Tg) that is high enough to prevent the polymer-based film from softening that has a range of approximately 80° C. to approximately 150° C.

Figure 4A:
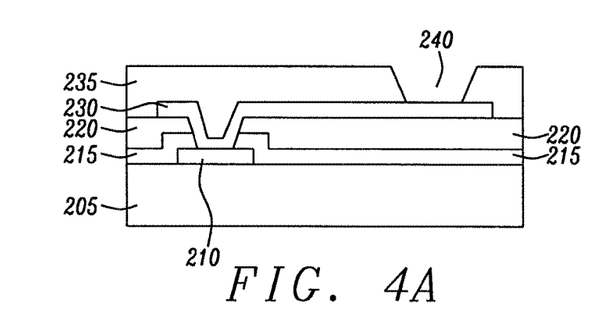
FIGS. 4A-4C are cross-sectional diagrams of a two-mask process for forming a copper pillar connection system of an integrated circuit chip for connecting to a second level packaging (board or module) for wafer level chip scale packages of the present disclosure.
Figure 4B:
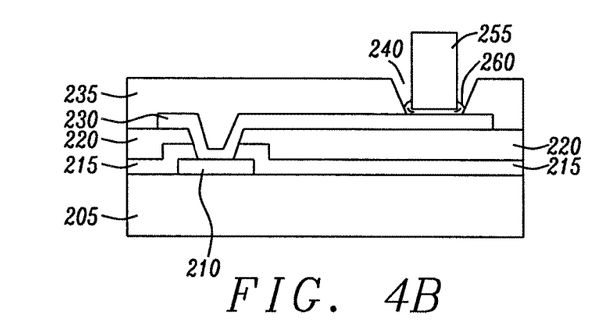
Figure 4C:
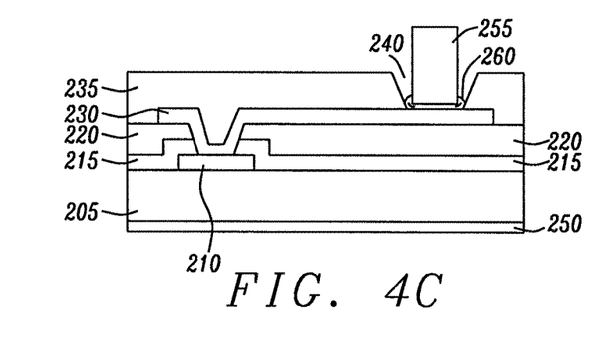

FIGS. 4A-4C are cross-sectional diagrams of a two-mask process for forming a copper pillar connection 255 system of an integrated circuit chip on an integrated circuit wafer 205 for connecting to a second level packaging (board or module) for wafer level chip scale packages of the present disclosure. The beginning steps of the method are identical to the step of the process shown in FIGS. 3A-3C where the integrated circuit wafer 205 is provided with patterned with functional electronic circuitry. The integrated circuit wafer 205 is covered with a passivation insulation layer 215 with openings 217 to allow access to the input/output contacts of the integrated circuit 205.

A coating of a dielectric material 220 is applied to the integrated circuit wafer 205 with the opening location 217 for a redistribution layer interconnection. A redistribution conductive layer 230 is formed upon the dielectric polymer layer 220 to make contact through the openings 217.

A polymer-based film 235 is formed on the surface of the integrated circuit wafer 205 as described above. Again the alignment marks (not shown) are placed on the edge of the integrated circuit wafer 205.

A laser ablation process is implemented to prepare through mold via (TMV) 240 in the cured thermoset plastic material 235 in the location 240 of an input/output connector 255 for connection to the second level package.

The input/output connectors are a copper pillars 255 that are coated with a solder paste 260. The solder paste 260 is reflowed to connect the copper pillars 255 with the redistribution conductive layers 230 pad surfaces.

The integrated circuit chip includes a backside film 250 that is affixed to the backside of the integrated circuit wafer 205 for preventing scratching or cracking. As described above, the backside film 250 in various embodiments a thermoset plastic such as an epoxide commonly known as Epoxy. In various other embodiments, the backside film is a polymer with a high glass transition temperature (Tg) that is high enough to prevent the polymer-based film from softening, which has a range of approximately 80° C. to approximately 150° C.

Figure 5:
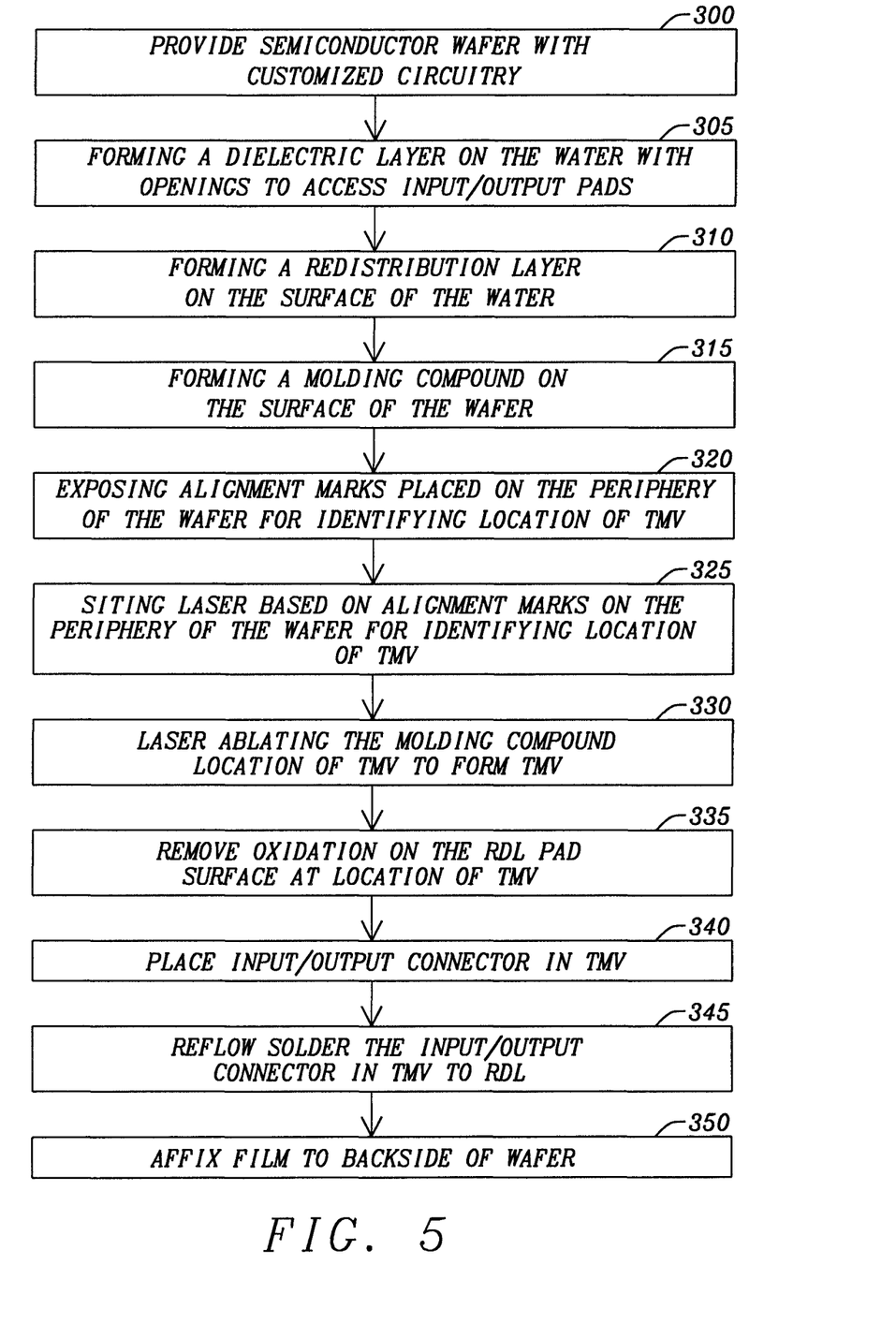
FIG. 5 is a flow diagram of a two-mask process for forming a ball bond connection system of an integrated circuit chip for connecting to a second level packaging (board or module) for wafer level chip scale packages of the present disclosure.

FIG. 5 is a flow diagram of a two-mask process for forming a ball bond connection system of an integrated circuit chip for connecting to a second level packaging (board or module) for wafer level chip scale packages of the present disclosure. An integrated circuit wafer is provided (Box 300) contains integrated circuit chips that are patterned with functional electronic circuitry and covered (Box 305) with a dielectric material with openings to allow access to the input/output contacts of the integrated circuit chip.

A redistribution conduction layer is formed (Box 310) upon the dielectric polymer layer to make contact through the openings in the dielectric layer and the passivation layer with the input/output contacts of the integrated circuit formed on the surface of the integrated circuit wafer with the locations where the input/output contacts are attached. The redistribution conduction layer is formed by coating the surface of the integrated circuit wafer containing the integrated circuit chip with a coating of a dielectric material. The integrated circuit wafer undergoes a photo exposure and developing process to define the opening locations for a redistribution conductive layer connection. The dielectric material is a photo-sensitive polymer dielectric such as Polyimide (PI), Polybenzoxazole (PBO), and Benzocyclobutene (BCB).

The redistribution conductive layer includes a sputtered a seed layer material such as titanium (TI) or copper (Cu) laid on the coating of dielectric material. The sputtered seed material is characterized by spinning a coating of photoresist onto the integrated circuit wafer. The photo resist is photo exposed and developed to define redistribution conductive layer pattern. The redistribution conductive layer further includes an a copper or aluminum layer that is electrically plated on the integrated circuit wafer containing the integrated circuit chip to its targeted thickness. The photoresist material is removed by a striping process and a chemical etching is used to remove unnecessary seed layer. A plasma process is activated to clean the surface of the passivation and redistribution conductive layer surface.

The integrated circuit wafer has a polymer-based film applied (Box 315) to its surface and is subjected to a compression molding process. The polymer-based film in various embodiments a thermoset plastic such as an epoxide commonly known as Epoxy. In various other embodiments, the polymer-based film is a polymer with a high glass transition temperature (Tg) that is high enough to prevent the polymer-based film from softening.

Alignment marks are exposed (Box 320) that have been placed on the edge of the integrated circuit wafer by removal of the polymer-based film after the molding process (Box 315). A post mold curing process is performed on the integrated circuit wafer to let the molding compound material to be fully cross linked.

Siting (Box 325) laser based on alignment marks on the periphery of the wafer for identifying location of through mold vias (TMV). The through mold vias (TMV) formed Box 330) by a laser ablation of the polymer-based film in the location of an input/output connectors for connection to the second level package. Oxidation on the redistribution conductive layers' pad surfaces are removed (Box 335) by flux printing or pin transferring before input/output connectors 240 placement to get better solder joint connection. The integrated circuit chip has input/output connectors placed (Box 340) in each of the through mold vias and are connected (Box 345) to the redistribution conductive layer by a solder reflow process. The input/output connectors are solder balls or copper pillar.s In various embodiments where the input/output connectors are solder balls the reflow process is a solder reflow of the solder that forms the solder balssl. In various embodiments where the input/output connector are copper pillars, the copper pillars are coated with a solder paste and the solder paste is reflowed to connect the copper pillars with the redistribution conductive layers' pad surfaces.

A backside film that is affixed (Box 350) to the backside of the integrated circuit wafer for preventing scratching or cracking. The backside film is a polymer-based film is applied to the backside surface of the integrated circuit wafer. The backside film in various embodiments a thermoset plastic such as an epoxide commonly known as Epoxy. In various other embodiments, the backside film is a polymer with a high glass transition temperature (Tg) that that has a range of approximately 80° C. to approximately 150° C. to prevent the polymer-based film from softening.

While this disclosure has been particularly shown and described with reference to the preferred embodiments thereof, it will be understood by those skilled in the art that various changes in form and details may be made without departing from the spirit and scope of the disclosure.

What is claimed is:

1. A method for forming a wafer level chip scale package comprising the steps of:

provided an integrated circuit wafer having been patterned with functional electronic circuitry and covered with a passivation insulation layer with openings to allow access to input/output contacts of the integrated circuit;

applying a coating of a dielectric material to the integrated circuit wafer;

forming opening locations for a redistribution layer in the dielectric material;

forming the redistribution conductive layer upon the dielectric polymer layer to make contact through the openings in the dielectric layer and the passivation layer with the input/output contacts of the integrated circuit formed on the surface of the integrated circuit wafer;

forming alignment marks are placed on the edge of the integrated circuit wafer;

applying a polymer-based film to the surface of the integrated circuit wafer;

performing compression molding on the polymer-based film;

exposing the alignment marks after the molding process;

forming a through mold via (TMV) in the polymer-based film in the location of an input/output connector for connection to the second level package; and placing the input/output connector in the through mold via (TMV); and attaching the input/output connector to the redistribution level.

2. The method of claim 1 wherein the input/output connector is a solder ball, the reflow process is a solder reflow of the solder that forms the solder ball.

3. The method of claim 1 wherein the input/output connector is a copper pillar, the copper pillar is coated with a solder paste and the solder paste is reflowed to connect the copper pillar with the redistribution conductive layer's pad surface.

4. The method of claim 1 further comprising affixing a backside film to a backside of the integrated circuit wafer for preventing scratching or cracking.

5. The method of claim 4 wherein affixing the backside film comprises the step of applying the polymer-based film to the backside surface of the integrated circuit wafer.

6. The method of claim 4 wherein the backside film is a thermoset plastic.

7. The method of claim 6 wherein thermoset plastic is an epoxide.

8. The method of claim 4 wherein the backside film is a polymer with a high glass transition temperature (Tg) that is high enough to prevent the polymer-based film from softening within the operating temperature of an integrated circuit chip from the integrated circuit wafer.

9. The method of claim 8 wherein the glass transition temperature has a range of approximately 80° C. to approximately 150° C.

10. The method of claim 1 wherein forming the redistribution conductive layer comprises the steps of:

a sputtered a seed layer material laid on the coating of dielectric material;

characterizing the seed layer material by spinning a coating of photoresist onto the integrated circuit wafer;

exposing and developing the photo resist to define redistribution conductive layer pattern;

electroplating a conductive metal layer on the seed layer to the targeted thickness of the redistribution layer;

removing the photoresist material by a striping process and chemical etching to remove unnecessary seed layer; and cleaning the surface of the passivation and redistribution conductive layer surface with a plasma process.

11. The method of claim 10 wherein the seed layer is titanium (TI) or copper (Cu).

12. The method of claim 10 wherein the electroplated conductive metal is copper or aluminum.

13. The method of claim 1 wherein the dielectric material is a photo-sensitive polymer.

14. The method of claim 13 wherein the dielectric material is Polyimide (PI), Polybenzoxazole (PBO), or Benzocyclobutene (BCB).

15. The method of claim 1 wherein the polymer-based film is a thermoset plastic.

16. The method of claim 15 wherein the thermoset plastic is an epoxide.

17. The method of claim 15 wherein the polymer-based film has a high glass transition temperature (Tg) that is high enough to prevent the polymer-based film from softening.

18. The method of claim 17 wherein the glass transition temperature has a range of approximately 80° C. to approximately 150° C.

19. The method of claim 1 wherein forming the through mold via (TMV) comprises the step of laser ablating the polymer-based film in the location of an input/output connector for connection to the second level package for creating the through mold via (TMV).

20. An integrated circuit chip module comprising:

an integrated circuit chip patterned with functional electronic circuitry and covered with a passivation insulation layer with openings to avow access to the input/output contacts of the integrated circuit chip comprising:

a backside surface of the integrated circuit chip comprising a backside film affixed for preventing scratching or cracking, a dielectric material applied to an upper surface of the integrated circuit chip, a redistribution conductive layer formed upon the dielectric material to make contact through the openings in the dielectric layer and the passivation layer with the input/output contacts of the integrated circuit formed on the surface of the integrated circuit wafer, and a first polymer-based film applied to the surface of the integrated circuit chip and compression molded to the surface of the integrated circuit chip;

a through mold via (TMV) formed in the first polymer-based film in the location of an input/output connector for connection to the second level package; and at least one input/output connector placed in the through mold via (TMV) and affixed to the redistribution conductive layer;

wherein the backside film is a second polymer-based film with a high glass transition temperature (Tg) that is high enough to prevent the second polymer-based film from softening within the operating temperature of an integrated circuit chip to prevent the scratching and cracking.

21. The integrated circuit chip module of claim 20 wherein the input/output connectors are solder balls wherein a reflow process causes the solder to flow on the solder balls and connect to the redistribution conductive layer.

22. The integrated circuit chip module of claim 20 wherein the input/output connector is a copper pillar that is coated with a solder paste and reflowed to connect the copper pillar with the redistribution conductive layer's pad surface.

23. The integrated circuit chip module of claim 20 wherein the backside film is a thermoset plastic.

24. The integrated circuit chip module of claim 23 wherein thermoset plastic is an epoxide.

25. The integrated circuit chip module of claim 20 wherein the glass transition temperature has a range of approximately 80° C. to approximately 150° C.

* * * * *